United States Patent [19]

O'Donnell et al.

[11] Patent Number: 5,005,419
[45] Date of Patent: Apr. 9, 1991

[54] METHOD AND APPARATUS FOR COHERENT IMAGING SYSTEM

[75] Inventors: Matthew O'Donnell, Schenectady; Kenneth B. Welles, II, Scotia, both of N.Y.; Carl R. Crawford, Milwaukee; Norbert J. Pelc, Wauwatosa, both of Wis.; Steven G. Karr, Scotia, N.Y.

[73] Assignee: General Electric Company, Schenectady, N.Y.

[21] Appl. No.: 207,532

[22] Filed: Jun. 16, 1988

[51] Int. Cl.$^5$ .............................................. G01N 29/00
[52] U.S. Cl. ................................ 73/626; 128/661.01; 364/413.25
[58] Field of Search .................... 73/626, 625, 628; 364/413.25, 413.13; 128/661.01, 660.06, 660.08

[56] References Cited

U.S. PATENT DOCUMENTS

| | | | |
|---|---|---|---|
| 4,155,260 | 5/1979 | Engeler et al. | 73/626 |
| 4,325,257 | 4/1982 | Kino et al. | 73/626 |
| 4,442,715 | 4/1984 | Brisken et al. | 73/626 |
| 4,488,434 | 12/1984 | O'Donnell | 73/602 |
| 4,534,359 | 8/1985 | Miller-Jones et al. | 128/660.06 |
| 4,569,231 | 2/1986 | Carnes et al. | 73/626 |
| 4,669,314 | 6/1987 | Magrane | 73/610 |
| 4,788,981 | 12/1988 | Nagasaki et al. | 73/626 |
| 4,835,689 | 5/1989 | O'Donnel et al. | 364/413.13 |

Primary Examiner—Hezron E. Williams
Assistant Examiner—Louis M. Arana
Attorney, Agent, or Firm—John F. McDevitt

[57] ABSTRACT

A method and apparatus for improved digital processing of the analog echo signals in a coherent imaging system is described which simplifies the channel circuitry requirements. The analog echo signals detected with a phased array of transducer elements are first compressed in a non-linear manner then expanded non-linearly with analog-to-digital converter means to provide increased instantaneous dynamic range in the overall system. Representative phased array coherent imaging systems having the improved digital processing means are also disclosed.

55 Claims, 2 Drawing Sheets

METHOD AND APPARATUS FOR COHERENT IMAGING SYSTEM

BACKGROUND OF THE INVENTION

This invention relates to coherent imaging systems using vibratory energy, such as ultrasonic or electromagnetic waves, and, more particularly to a novel method and apparatus for digital signal processing of the vibratory energy signals.

Various methods and apparatus are already known for imaging object points with vibratory energy, such as ultrasonic mechanical vibrations, and which generally employ at least one array of transducer elements to produce the desired image. In ultrasonic imaging systems, the transducer elements are excited to transmit ultrasonic waves into the object region while further receiving echo signals produced from impingement of the transmitted energy with at least one object point in the object region. One type of such ultrasonic imaging system using a baseband frequency signal processing technique is described in U.S. Pat. No. 4,155,260, which is assigned to the assignee of the present invention, to provide real time imaging that is particularly useful in various analytic arts such as medicine and the like. The disclosed system includes coherent demodulation of the echo signals followed by the time delay and coherent summation of the demodulated signals in a manner dramatically reducing the accuracy necessary for the time delays. In a different imaging system of this general type as disclosed in pending applications Ser. No. 944,482, filed Dec. 19, 1986 now U.S. Pat. No. 4,809,184, and Ser. No. 056,177, filed June 1, 1987 now U.S. Pat. No. 4,839,652, both assigned to the present assignee, the transducer elements are excited with a radio frequency (RF) signal and generate RF analog echo signals for processing in the operatively associated circuitry. All of the above mentioned commonly assigned inventions are specifically incorporated by reference into the present application since the digital signal processing improvements herein disclosed can not only be employed with both type systems but can further improve those ultrasonic imaging systems wherein electrical signals are demodulated to an intermediate frequency (IF) and further processed with associated digital processing circuitry.

As above indicated, certain general considerations apply in forming a real time image with a linear array of transducer elements as now commonly employed especially with respect to the ultrasonic imaging systems being used for medical examinations. Compensation is required therein since the echo from an object point arrives at the receiving transducer elements at different times due to differences in time of propagation of the echo from the object point to the transducer elements. In the phased array sector scanner (PASS) system disclosed in the above referenced U.S. Pat. No. 4,155,260, such compensation is provided with analog signal processing techniques to perform a coherent summation of the echo signals received along the plurality of transducer elements forming the front end of the PASS array. A significant improvement derived with the disclosed ultrasonic imaging system results from signal processing at lower baseband frequencies wherein phase accuracy and time delay accuracy are decoupled from each other and which dramatically reduces the requirements on the circuits used for beam formation. On the other hand, such PASS array remains relatively inflexible, sensitive to minor variations in the operating characteristics of analog circuits, and is relatively expensive (as 2N individual analog demodulation circuits and 2N individual and complete time delay sections are required for an N channel array). Somewhat reduced analog signal processing requirements are involved in the already known ultrasonic imaging system wherein the echo signals are processed at frequencies intermediate between a baseband frequency and RF frequencies. In this type system, a single channel is employed for each individual transducer element wherein the analog echo signal is first demodulated, then band pass filtered, and finally digitally processed for time delay in providing the required coherent summation. The substantial drawbacks encountered with use of analog signal processing techniques in a real time imaging system can be avoided with digital beam formation as disclosed in the above commonly assigned copending patent applications. As therein disclosed, fully digital beam formation is provided in a phased array coherent imaging system, such as an ultrasonic medical imaging system, in a far more accurate, flexible and cost-effective manner. Real-time beam formation is therein achieved with individual channels being provided for the respective transducer elements which convert the analog echo signals to digital data words after preamplification and without converting the RF frequency signals to lower baseband frequencies. As can be further noted in the disclosed digital beam formation, the required coherent summation across individual channels of the array can thereafter be achieved with digital signal processing means to provide a digital representation of the object points detected with the respective transducer elements. Digital baseband processing can be employed to further reduce the complexity of the limited analog circuitry being used in such prior art systems providing a digital beam formation. Understandably, the analog circuit portions of such digital imaging systems must also insure proper signal processing over a wide range of operating conditions.

Still other important considerations apply when any of the aforementioned type imaging systems are used for medical examinations. The dynamic range in such systems should enable detection of all object points in the patient being examined from the scattered echo signals as well as encompass differential losses due to inhomogeneous signal propagation. The largest signals arise from specular reflections which can be illustrated with respect to a human heart organ. Thus, the reflection coefficient for a blood-heart interface is about $-30$ dB while blood-valve interface can have significantly higher reflection coefficients. Also, the reflection coefficient from the surface of the heart in contact with the thoracic cavity can be nearly 0 dB. Soft tissues echoes arising from volume scattering within the myocardium at the 2 to 5 MHz transducer emission center frequency commonly employed in such type imaging systems can be in the $-55$ dB range. It follows that dynamic range requirements for the above indicated transmission frequencies to detect the smallest specular echoes as well as the smallest tissue echoes can thereby exexceed 60 dB. A proper medical imaging system should further differentiate between object points exhibiting different echo intensities which reside at a common distance from the transducer array. Such requirement is commonly termed "instantaneous dynamic range" for the particular imaging system and with the requirement relating to object points located on a circular arc having its center at the midpoint of the linear transducer array customarily employed. Such instantaneous dynamic range must account for differential losses due to inhomogeneous signal propagation within the patient or specimen being examined. This problem can be illustrated for a transmitted energy beam traversing soft tissue as compared with traversing a lower loss blood path. The magnitude of such differential loss taking into account the round trip propagation path involved can require a 60 dB instantaneous dynamic range at 3.3 MHz transmission frequency while a 65-70 dB instantaneous dynamic range can be required at a 5.0 MHz frequency operation to ensure that all echo signals of interest will be detected.

All of the aforementioned type imaging systems customarily employ analog-to-digital converter means for the purpose of digitally processing the analog echo signals in order to form the coherent image. For example, such analog-to-digital converter means find use in providing the phase relationship and time delay signals required by the imaging system disclosed in the above referenced U.S. Pat. No. 4,155,260 to do so. Similarly, both imaging systems disclosed in the above referenced commonly assigned copending applications convert the analog echo signal into digital data words for processing with analog-to-digital converter (ADC) means while further recognizing that the sampling ratio involved can require relatively high speed and high cost ADC devices to be employed along with a relatively large amount of high speed memory storage means. As more specifically illustrated in the copending applications, an 8-bit 40 MHz ADC device is employed accompanied by at least 400 words of a high speed RAM for required data delay in each channel of the transducer array. It would be understandably desirable to reduce such requirements with use of standard linear ADC devices but to do so in a manner not degrading the dynamic range of the imaging system. Since the number of bits in the ADC device determines its cost for the most part along with the cost of delay lines operatively associated therewith to digitally process the signals in such type imaging systems it thereby becomes advantageous to reduce the ADC bit requirement without significantly reducing the dynamic range of the modified digital processing means.

Accordingly, it is an object of the present invention to provide a novel coherent imaging system using vibratory energy which digitally processes the analog echo signals in an improved manner.

It is a further object of the present invention to provide a novel coherent imaging system using vibratory energy which includes non-linear processing of the analog echo signals to enable formation of the coherent image with delayed digital data signals.

Still another object of the present invention is to simplify circuit requirements for digitally processing analog echo signals in a coherent imaging system using vibratory energy.

A still further object of the present invention is to provide a novel ultrasonic phased array sector scanner (PASS) to rapidly and accurately sweep a formed ultrasonic beam and which includes non-linear processing of the returned analog echo signals to enable formation of the coherent image with delayed digital data signals.

Another object of the present invention is to provide a fully digital PASS system which digitally processes the analog echo signals in an improved manner.

A further object of the present invention is to provide a novel method of forming a real-time image with vibratory energy which digitally processes the return echo signals in an improved manner.

These and other objects of the present invention will become apparent to those skilled in the art upon reading the following detailed description in conjunction with the appended drawings. In so doing, it should be understood that while the present invention will be described in connection with one energy form, e.g. ultrasonic mechanical vibrations, that still other forms of vibratory energy can be used, such as coherent electromagnetic energy in ladar and radar imaging systems as well as other types of acoustic energy systems such as sonar and the like.

SUMMARY OF THE INVENTION

In accordance with the present invention, the analog-to-digital conversion means for a typical coherent imaging system are modified in a manner whereby the output signals bear a non-linear relationship to the input signals. To do so first requires that the analog echo signals being processed in the imaging system be non-linearly compressed to provide additional instantaneous dynamic range whereby substantially all scatterers in the object region will be detected and any inhomogeneous propagation in the object region will be encompassed, as hereinbefore indicated. Such requirement can be satisfied in a manner well known in the art whereby the total dynamic range at fixed depth as determined by the full transmit/receive beamformer in a typical imaging system exceeds the dynamic range for the receive beamformer by a predetermined amount. For example, a representative imaging system having a 40 dB receive beamformer dynamic range should have a 70-80 dB transmit/receive beamformer dynamic range in order to meet such requirement. The required analog signal compression can be provided with bipolar amplifier means producing output signals bearing a non-linear relationship to the input signals. By such means, it becomes further possible to convert analog signals originally having a relatively large dynamic range to expanded digital data signals with conventional low bit density analog-to-digital converter means. To further illustrate, analog echo signals with a total dynamic range of 70 dB or greater can now be digitally processed with a 7 bit A/D converter device. In doing so, expansion of the digital data signals is achieved so that the digital output signals from the selected A/D converter device are related to the input analog signals in a non-linear manner which is the inverse of the compression function previously employed. An appropriate expansion for the above illustrated 7 bit A/D converter devices provides an 11 bit digital output signal thereby altering the voltage quantization as a function of the input signal level. Alternately, the reference ladder of the A/D converter itself can be altered to provide a variable voltage quantization as a function of the input signal level. Signal processing in the foregoing manner produces a minimum of artifacts and does not significantly reduce the instantaneous dynamic range for the digital beamformer. A coherent image can thereafter be formed with the expanded digital data signals in a customary manner whereby these signals are delayed by a predetermined time interval corresponding to the distance of the respective transducer elements from the detected object points which causes each data signal to occur at substantially the same time and with the time delay signals being summed together. In a slightly alternative structure, the compressed signal is digitized by the A/D converter, time delayed and then expanded and summed across the array. The total bit density of the digital time delay structure can be reduced in this approach since only the low bit density output of the A/D converter is preserved in the time delay. However, the signal must be expanded prior to any summations with other channels in the array to produce the final output of the beamformer.

Circuit means to digitally process the analog echo signals in the above described manner can be provided in various ways. For example, preamplification as well as compression of the preamplified analog echo signals can be performed in a single non-linear bipolar amplifier device as distinct from sequentially employing linear amplifier means for the preamplification with non-linear amplifier means thereafter providing the compression. Also, the non-linear compression can be performed in the A/D converter itself by varying the reference voltages to the resistor ladder of the A/D converter in proportion to the input signal level or by producing a non-linear resistor ladder in the A/D and holding fixed reference voltages across this ladder. Correspondingly, satisfactory non-linear compression can be achieved according to various mathematical functions. A representative compression relates the output analog signals to the input analog signals by a power law function with an exponent less than one. A different representative compression can be formed with a connected series or piecewise aggregate of straight lines approximating the desired signal interrelationship. Expanding the voltage quantization in the selected A/D converter means as a function of input signal level can be achieved with various conventional circuit means. A ROM device or SRAM device can be operatively associated with the selected A/D converter device as a "look-up table" while the routine computations to provide a non-linear expansion which is the inverse of the compression function can also be carried out by computer chip. Relatively simple circuitry for the presently modified overall analog-to-digital conversion means can be provided with a linear amplification operatively associated with an A/D converter device exhibiting non-uniform quantization levels. Further, while logarithmic signal processing in the present analog-to-digital converter means is deemed optimal for an ultrasonic imaging system whereby multiplicative noise is expected, other non-linear transfer functions can be used to compensate for additional noise factors.

It will be apparent from all of the forgoing description, therefore, that voltages representing the analog echo signals detected by the individual transducer elements in the present coherent imaging system can be processed by various means. The signal processing means employs at least one A/D converter device so that a stream of digital data signals is first provided bearing a mathematical relationship to the analog echo voltage signals which is a non-linear compression function. Such non-linear signal compression as above pointed out, can be performed with bipolar amplifier means providing output signals which are non-linearly related to the input signals as well as being provided with the associated A/D converter device alone. The compressed digital data signals are thereafter processed in accordance with the inverse of the previously employed mathematical function to provide expanded digital data signals which are linearly related to the analog echo voltage signals. Such non-linear signal expansion, as further above pointed out, can be provided by various means which process the output signals obtained from the associated A/D converter device. To further illustrate in this regard, look-up table means and already known computerized circuitry can provide alternative means to achieve the signal expansion. A further essential time delay means is required to delay the stream of digital data signals after compression and before or after being expanded. It becomes thereafter only essential to provide circuit means whereby the delayed expanded digital data signals are summed in the conventional manner.

A representative apparatus embodiment providing improved digital beam formation in a coherent imaging system according to the present invention employs (a) an array of transducer elements which transmits a burst of vibratory energy of predetermined excitation frequency into the object region and receives bipolar analog echo signals produced from impingement of the transmitted energy beam with at least one object point in the object region, (b) bipolar amplifier means for compressing the bipolar analog echo signals so that the output signals are non-linearly related to the input signals, (c) analog-to-digital converter means to expand the compressed analog input signals to a stream of digital data signals having an inverse non-linear relationship to the compressed analog input signals, (d) means for delaying the expanded digital data signals by respective predetermined time intervals corresponding to the distance of the detected object point from the respective transducer elements which causes each data signal to occur at substantially the same time, and (e) means to obtain a summation of the delayed expanded digital data signals. As a more detailed illustration of such apparatus embodiment in connection with a phased array sector scanner (PASS) wherein the analog echo signals were processed at a 20 MHz frequency rate and using a 7 bit A/D converter device, the digital word stream will be expanded to 11 bits using a SRAM look-up table. In doing so, the compression amplifier approximates a power law function and the output of the SRAM preserves the input sign and exponentiates the magnitude to the power y, where $y = 1/x$. Proceeding from a 7 to 11 bit word results in $x = 0.6$ so that the net effect of processing alters the voltage quantization as a function of input signal level wherein the maximum quantization level will be approximately y times the quantization level for a linear processing system. As a result, the instantaneous dynamic range of the 7 bit converter can be utilized over a much larger range of analog echo signals. Further circuit implementation of the apparatus embodiment herein being illustrated for a single channel in the transducer array can utilize a conventional preamplification means including a time gain control (TGC) circuit and which further includes low-pass filter means to process the received analog echo signals prior to its compression. To further illustrate in connection with the embodiment, a linear bipolar amplifier can be employed having a gain not exceeding approximately 12 dB while the maximum gain in the TGC should not exceed 40 dB. A suitable pass band filter means in the herein illustrated embodiment can have a low frequency cutoff at about 500 KHz and a high frequency cutoff of about 10–12.5 MHz. As thus configured, the illustrated A/D converter means can handle a 2 volt analog echo signal variation.

In a different aspect of the present invention, the presently improved analog-to-digital converter means can replace the conventional linear A/D converter means being utilized in any of the prior art phased array coherent imaging systems (PASS) disclosed in the above referenced U.S. Pat. No. 4,155,260 and commonly assigned copending applications. To further illustrate, such prior art imaging systems disclose initial formation of a pair of analog signals (I and Q) in separate channels operatively associated with the individual transducer elements which can thereafter be converted to digital data signals by the linear A/D converter means for separate delay and summation in the already known fashion. The analog echo signals being processed in this manner are generally demodulated at a predetermined excitation frequency and phase as determined by the product of the reference angular frequency ($2\pi f$) with the predetermined time interval corresponding to the distance between respective transducer elements and the detected object points which causes each data signal to occur at substantially the same time. Accordingly, a representative apparatus embodiment providing improved signal processing in the foregoing general manner according to the present invention can employ (a) an array of transducer elements which transmits a burst of ultrasonic energy at a predetermined excitation frequency into the object region and received bipolar analog echo signals produced from impingement of the transmitted ultrasonic beam with at least one object point in the object region, (b) a pair of demodulator means operatively associated with each transducer element to provide demodulated bipolar analog echo signals of different relative phase, the demodulator means operating at a predetermined excitation frequency with phase being determined by the product of the reference angular frequency with the predetermined time interval corresponding to the distance between respective transducer elements and detected object points to cause such data signal to occur at substantially the same phase, (c) a pair of bipolar amplifier means for compressing the demodulated analog echo signals so that the output signals are non-linearly related to the input signals, (d) a pair of analog-to-digital converter means to separately expand the compressed demodulated analog input signals to a stream of digital data signals having an inverse non-linear relation to the compressed demodulated analog input signals, (e) means to separately delay each stream of expanded digital data signals by a respective predetermined time interval corresponding to the distance between respective transducer elements and detected object points which causes each data signal to occur at the same time, (f) means to separately sum each stream of delayed expanded digital data signals, and (g) means to detect the signal as the square root of the sum of the squares of the two summed in phase and quadrature signals. As hereinabove mentioned with respect to suitable circuit implementation of the presently modified non-linear analog-to-digital conversion means for the present invention, a linear 7 bit A/D converter means can be employed in each of the respective transducer channels along with suitable memory means to separately expand the individual streams of digital data signals so that output signals represent a non-linear expansion which is the inverse of the compression function. A power law data manipulation can be employed for this purpose in the herein illustrated embodiment whereby the non-linear compression amplifier provides output signals related to the input signals by a power law function with an exponent less than one while the output signals from the non-linear A/D converter means are related to its input signals by the inverse power law function. Again, circuit implementation of the apparatus embodiment herein being illustrated can employ conventional mixing of the analog echo signals from each transducer element with localized oscillator means prior to the non-linear amplification and digital conversion. Likewise, optional low pass filtering means can also be incorporated in the individual channel circuitry prior to the non-linear data manipulation means for conventionally limiting the signals to the Nyquist range of the digital system.

DETAILED DESCRIPTION OF THE PREFERRED EMBODIMENTS

Figure 1:
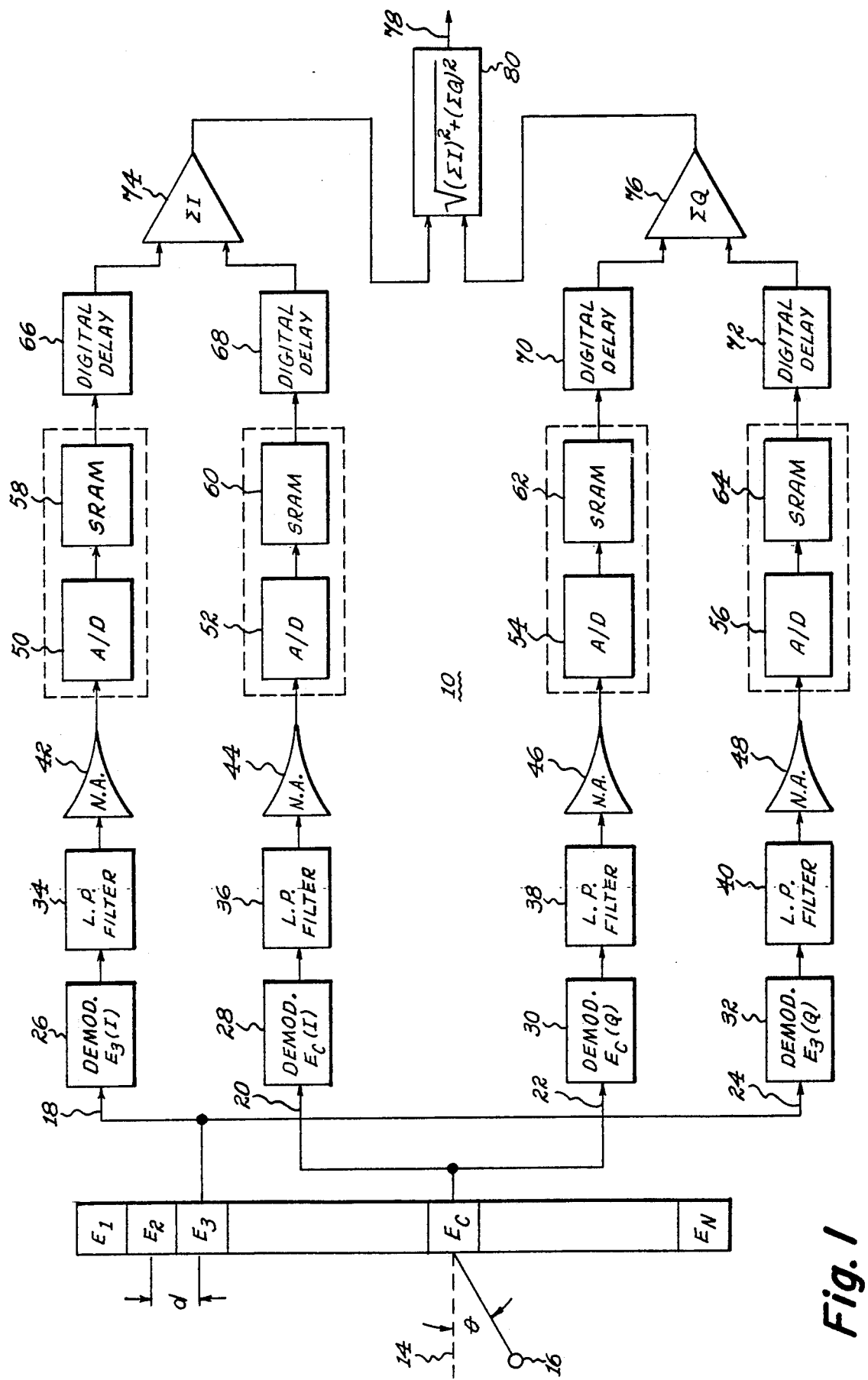
FIG. 1 is a schematic block diagram for a representative PASS type ultrasonic imaging system according to the present invention which employs digital baseband signal processing.

Referring now more specifically to the drawings, the preferred embodiments of the present invention are illustrated in connection with a PASS type ultrasonic imaging system more fully described in the above referenced U.S. Pat. No. 4,155,260. As shown in FIG. 1, there is illustrated a typical real-time ultrasonic imaging system 10 which includes coherent demodulation of the analog echo signals detected with a phased transducer array followed by time delay and coherent summation of the digitally delayed signals. The system further includes one form of the improved digital signal processing means according to the present invention as more fully hereinafter described. As shown in the functional block diagram, the apparatus 10 includes a linear phased array 12 of individual transducer elements $E_1$-$E_N$ which are spaced at a center line distance "d" from each other along midpoint line 14 in the conventional arrangement. An object point 16 in the object region being scanned with the transducer array forms an angle $\Theta$ with midpoint line 14 and a burst of ultrasonic energy produced with the array impinges upon the object point to produce a bipolar analog echo signal which is detected by one or more elements in the array. Bipolar electrical analog signals are formed by the transducer elements representing the received echo signals and with the processing of the electrical signals being hereinafter described for a pair of transducer elements ($E_3$ and $E_c$), although it should be appreciated that like signal processing occurs with respect to any other signals being simultaneously generated in the remaining transducer elements. Accordingly, representative analog electrical signals from transducer elements $E_3$ and $E_c$ are processed in separate I and Q channels of the depicted system wherein demodulation is employed to establish the customary phase quadrature relationship. Such demodulation can be provided by mixing each input analog signal 18–24 to the operatively associated respective demodulator means 26–32 with quadrature signals provided by local oscillator means (not shown) at the predetermined baseband operating frequency. Optional low pass filtering means 34-40 are included in the depicted system to improve signal to noise ratio while still further amplification of the demodulated I and Q analog signals (not shown) can also be included as a means to avoid saturation of the analog-to-digital converter devices subsequently employed for conversion of these analog signals. Each of the demodulated and filtered analog signals 18-24 is next applied to respective compression amplifier means 42-48 wherein the output signals are non-linearly related to the input signals. More particularly, a power law signal compression can be achieved in the depicted non-linear amplifier means 42-48, such as with logarithmic signal processing, so that relatively low bit density conventional linear A/D converter devices are now found suitable in carrying out the required digital transformation. Each compressed analog signal 18-24 is next individually sampled and the amplitude thereof converted to a digital data word in the respective linear A/D converter devices 50-56 which further cooperate with operatively associated SRAM memory devices 58-64, respectively, to expand the output digital data signals in a non-linear manner. The non-linear digital data expansion is performed in the hereinbefore explained manner which can be the inverse of the power law compression function employed above to derive the compressed analog signals. To further illustrate a typical result achieved with such digital data expansion, the employment of conventional 7 bit A/D converter devices in the depicted system can provide expansion to 11 bit digital output words upon providing the appropriate look-up table in the associated SRAM memory devices. Each of now expanded digital data signals 18-24 formed responsive to the present analog-to-digital converter means are separately delayed for a predetermined time interval in one of the operatively associated digital delay means 66-72 to provide delayed baseband I and Q signals. All digitized and delayed I and Q signals from the collective transducer elements are then separately summed in the amplifier means depicted 74 and 76, respectively, employing the customary algebraic addition process. A final resultant signal 78 is formed in a conventional summing circuit 80 which is a monotonic function of the sum of the squares of the summed signals provided with amplifier means 74 and 76. More particularly, the amplitude of resultant signal 78 is proportional to the square root of the sum of the squares of the summed I and Q digital delay signals as further depicted in the present drawing. Such resultant signals may then be suitably displayed to provide a visual indication of the object points detected in a selected object region by already known means (not shown) such as for real-time medical examinations of the type hereinbefore explained.

Figure 2:
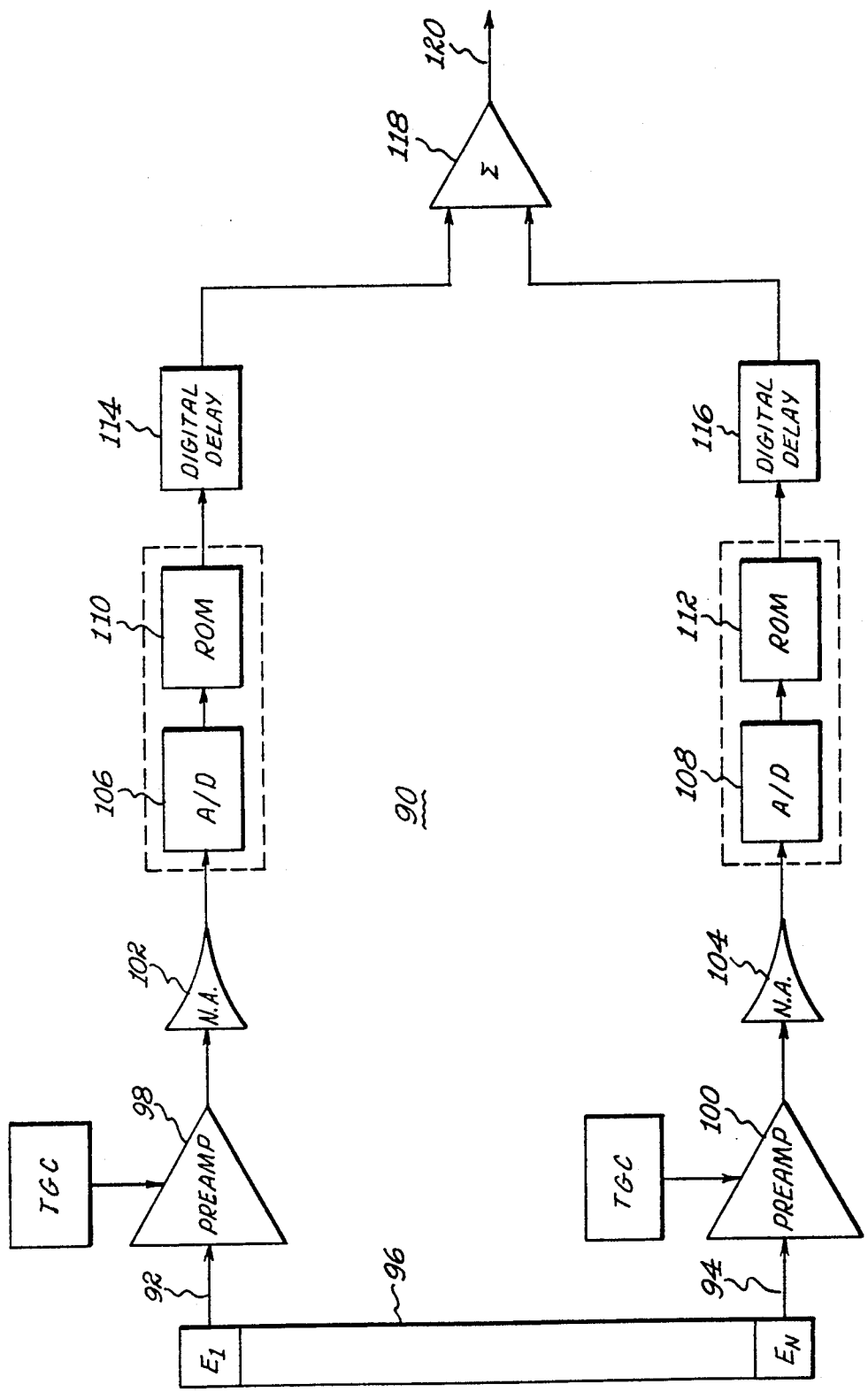
FIG. 2 is a schematic block diagram for a different representative PASS type ultrasonic imaging system according to the present invention employing digital processing at the RF excitation frequency of the transducer elements.

In FIG. 2 there is depicted a functional block diagram for a different representative PASS type ultrasonic imaging system according to the present invention. The presently illustrated typical real-time ultrasonic imaging system 90 employs digital processing at the RF excitation frequncy of the transducer elements to again provide coherent image formation of object points detected in the object region. As can be noted from a comparison between the FIG. 1 and 2 functional block diagrams, the presently illustrated apparatus embodiment thereby lacks frequency conversion or demodulation and employs but a single processing channel for operative association with each transducer element. The reduced circuitry requirements achieved in this manner further include elimination of the local oscillator signal generator and mixer circuit means previously employed. Thus, the analog signal outputs 92 and 94 representing echo signals detected by a pair of transducer elements ($E_1$ and $E_N$) in the presently depicted transducer array 96 can be directly applied after preamplification in conventional bipolar linear TGC amplifier means 98 and 100, respectively, to respective compression amplifier means 102 and 104. The gain in all channels provided with such preamplification means can be established with a common TGC control signal (not shown). The preamplified bipolar analog echo signals 92 and 94 are next applied to the respective compression amplifier means 102 and 104 wherein the output signals are again non-linearly related to the input signals. As also previously indicated, a power law signal compression is performed in the depicted non-linear bipolar amplifier means enabling relatively low bit density conventional linear A/D converter devices 106 and 108 to carry out the required digital transformation. In similar fashion ROM type memory devices 110 and 112 which are operatively associated with the respective A/D converter devices enable expansion of the output digital data signals upon being provided with a suitable look-up table. Such digital data expansion proceeds in a non-linear manner which can again be the inverse of the power law compression function employed to derive the compressed analog signals. Each of the expanded digital data signals formed by such analog-to-digital converter means is next applied to operatively associated time delay means 114 and 116 in the respective channels. The digitized and delayed signals 92 and 94 from all processing channels are thereupon added together by summing amplifier means 118 provided in the depicted system 90 to provide a combined resultant signal 120 representing a detected object point in the object region being scanned. Signal processing in the foregoing manner produces a minimum of artifacts and does not significantly reduce the instantaneous dynamic range for the described digital beam-former. Additional signal processing circuitry means can also be provided in the individual channels to still further benefit the overall system performance. For example, low pass filter means can be added to enhance system signal to noise ratio and with such filtering means processing the preamplified analog echo signals prior to compression. A suitable filter means for this purpose limits the signal response to the Nyquist range of the digital system. Other digital signal processing circuit means can also be incorporated into the present system embodiment to improve real-time beam formation such as disclosed in the above referenced commonly assigned copending applications.

While only certain preferred features of the invention have been shown by way of illustration, other modifications and changes will be apparent to those skilled in the art from the foregoing description. For example, the RF frequency echo signals employed in the above illustrated RF signal processing system can be frequency converted to an intermediate (IF) frequency prior to conversion to digital data signals for processing thereafter in the same manner as described in connection with the present RF signal processing system. Accordingly, it is to be understood that the appended claims are intended to cover all such modifications and changes as fall within the true spirit and scope of the present invention.

What we claim as new and desire to secure by Letters Patent of the United States is:

1. A medical imaging system for generating a stream of digital data signals with a vibrating energy beam having increased dynamic range which represents at least one object point detected in the object region including:
   (a) an array of transducer elements which produces bipolar analog echo signals from impingement with at least one object point in the object region,
   (b) means to process the analog echo signals with at least one analog-to-digital converter device so that a stream of digital data signals is obtained from the analog-to-digital converter device bearing a mathematical relationship to the analog echo signals which approximates a non-linear amplitude compression function,
   (c) means to non-linearly process the stream of compressed amplitude digital data signals from the analog-to-digital converter device in accordance with the inverse of the previously employed mathematical function and thereby gain expanded amplitude digital data signals which are linearly related to the analog echo signals,
   (d) means for delaying the stream of digital data signals after amplitude compression by respective predetermined time intervals corresponding to the distance of the detected object point from the respective transducer elements which causes each data signal to occur at substantially the same time, and
   (e) means to obtain a summation of the delayed expanded amplitude digital data signals.

2. The system of claim 1 wherein the analog echo signals are compressed in bipolar amplifier means providing output signals which are non-linearly related to the input signals.

3. The system of claim 1 wherein the analog echo signals are compressed in the analog-to-digital converter device.

4. The system of claim 3 wherein the analog echo signals are compressed with linear resistor ladder means by varying the reference voltage to the resistor ladder means in proportion to the input signal level.

5. The system of claim 3 wherein the analog echo signals are compressed with non-linear resistor ladder means by maintaining a fixed reference voltage level across the non-linear resistor ladder means.

6. A medical imaging system for generating a stream of digital data signals with a vibrating energy beam having increased dynamic range which represents at least one object point detected in an object region including:
   (a) an array of transducer elements which produces bipolar analog echo signals from impingement with at least one object point in the object region,
   (b) bipolar amplification means for compressing the amplitude of the bipolar analog echo signals so that the output signals are non-linearly related to the input signals,
   (c) analog-to-digital converter means to expand the amplitude of the compressed amplitude analog input signals to a stream of digital data signals having an inverse non-linear relationship to the compressed amplitude analog input signals,
   (d) means for delaying the stream of digital data signals after amplitude compression by respective predetermined time intervals corresponding to the distance of the detected object point from the respective transducer elements which causes each data signal to occur at substantially the same time, and
   (e) means to obtain a summation of the delayed expanded amplitude digital signals.

7. The system of claim 6 wherein the non-linear relationship between the compressed and expanded signals is a common power law function.

8. The system of claim 7 wherein the non-linear relationship between the compressed and expanded signals is a common logarithmic function.

9. The system of claim 6 wherein the non-linear relationship between the compressed and expanded signals can be represented by a connected series of straight lines approximating a power law function.

10. The system of claim 6 wherein the signal expansion is achieved in the analog-to-digital converter means with a memory storage device.

11. The system of claim 10 wherein the memory storage device employs look-up table means.

12. The system of claim 6 wherein the signal expansion is achieved in the analog-to-digital converter means utilizing operatively associated computer means.

13. The system of claim 6 wherein the expanded signals represent a non-linear expansion which is the inverse of the compression function employed to derive the compressed analog signals.

14. The system of claim 6 wherein at least one linear analog-to-digital converter device is employed with look-up table means to achieve the signal expansion.

15. The system of claim 6 which further includes linear preamplification of the analog echo signals prior to non-linear compression.

16. The system of claim 15 wherein the preamplification further includes operatively associated time gain control circuit means.

17. The system of claim 15 wherein preamplification and compression is achieved in a single non-linear bipolar amplifier device.

18. The system of claim 6 which further includes band pass filter means to improve the signal to noise ratio of the system.

19. The system of claim 6 wherein the time delay is performed prior to the digital expansion.

20. A medical imaging system for generating a stream of digital data signals with an ultrasonic energy beam having increased dynamic range which represents a plurality of object points detected in an object region comprising:
   (a) an array of transducer elements which produces bipolar analog echo voltage signals from impingement with each object point detected in the object region,
   (b) linear bipolar preamplifier means to increase the amplitude of the analog echo voltage signals to a level permitting detection of object points substantially throughout the entire object region
   (c) means to process the analog echo voltage signals with at least one analog-to-digital converter device so that a stream of digital data signals is obtained from the analog-to-digital converter device bearing a mathematical relationship to the analog echo voltage signals which approximates a non-linear amplitude compression power function,
   (d) means to non-linearly process the stream of compressed amplitude digital data signals from the analog-to-digital converter device in accordance with the inverse of the previously employed mathematical power function and thereby obtain expanded amplitude digital data signals which are linearly related to the analog echo voltage signals, (e) means for delaying the expanded amplitude digital data signals by a respective predetermined time interval corresponding to the distance between the transducer elements and the detected object points which causes each data signal to occur at substantially the same time, and (f) means to obtain a summation of the delayed expanded amplitude digital data signals.

21. The system of claim 20 wherein the analog echo voltage signals are compressed in bipolar amplifier means providing output signals which are non-linearly related to the input signals.

22. The system of claim 20 wherein the analog echo voltage signals are compressed in the analog-to-digital converter device.

23. The system of claim 22 wherein the analog echo voltage signals are compressed with linear resistor ladder means by varying the reference voltage to the resistor ladder means in proportion to the input signal level.

24. The system of claim 22 wherein the analog echo voltage signals are compressed with non-linear resistor ladder means by maintaining a fixed reference voltage across the non-linear resistor ladder means.

25. The system of claim 20 wherein a linear analog-to-digital converter device is employed with look-up table means to achieve the signal expansion.

26. A medical imaging system for generating a stream of digital data signals with an ultrasonic energy beam having increased dynamic range which represents a plurality of object points detected in an object region including:

(a) an array of transducer elements which produces bipolar analog echo voltage signals from impingement with at least one object point in the object region, (b) a pair of demodulator means operatively associated with each transducer element to provide demodulated bipolar echo voltage signals of different relative phase, the demodulator means operating at a predetermined excitation frequency with phase being determined by the product of a predetermined reference angular frequency with a predetermined time interval corresponding to the distance between the respective transducer elements and the detected object points to cause each data signal to occur substantially at the same phase, (c) individual means each having at least one analog-to-digital converter device to separately compress the amplitude of the demodulated analog echo voltage signals and provide separate streams of digital data signals bearing a mathematical relationship to the respective analog echo voltage signals which approximates a non-linear amplitude compression power function, (d) individual means to separately expand each stream of compressed amplitude digital data signals from the respective analog-to-digital converter devices in accordance with the inverse of the previously employed mathematical power function and thereby obtain expanded amplitude digital data signals which are linearly related to the respective analog echo voltage signals, (e) means to separately delay each stream of expanded amplitude digital data signals by a respective predetermined time interval corresponding to the distance between respective transducer elements and detected object points which causes each data signal to occur at substantially the same time, and (f) means to separately sum each stream of delayed expanded amplitude digital data signals to provide a combined signal which is a monotonic function of the square of the individual summed digital data streams.

27. The system of claim 26 wherein the demodulated analog echo voltage signals are compressed in bipolar amplifier means providing output signals which are non-linearly related to the input signals.

28. The system of claim 26 wherein the demodulated analog echo voltage signals are compressed in the respective analog-to-digital converter devices.

29. The system of claim 28 wherein the demodulated analog echo voltage signals are compressed with linear resistor ladder means by varying the reference voltage to the ladder resistor means in proportion to the input signal level.

30. The system of claim 28 wherein the demodulated analog echo voltage signals are compressed with non-linear resistor ladder means by maintaining a fixed reference voltage across the non-linear resistor ladder means.

31. The system of claim 26 wherein linear analog-to-digital converter devices are employed with look-up table means to achieve the signal expansion.

32. The system of claim 26 wherein the analog echo voltage signals are mixed with local oscillator signals prior to compression.

33. In a vibratory energy coherent medical imaging system a method of processing the bipolar analog echo signals to provide increased dynamic range comprising the steps of:

(a) producing analog echo signals with a phased array of transducer elements, (b) processing the analog echo signals with means employing at least one analog-to-digital converter device so that a stream of digital data signals is obtained from the analog-to-digital converter device bearing a mathematical relationship to the analog echo signals which approximates a non-linear amplitude compression function, (c) processing the compressed amplitude analog echo signals from the analog-to-digital converter device in accordance with the inverse of the previously employed mathematical function and thereby obtain expanded amplitude digital data signals which are linearly related to the analog echo signals, (d) time delaying the expanded amplitude digital data signals by respective predetermined time intervals corresponding to the distance of a detected object point from the respective transducer elements which causes each data signal to occur at substantially the same time, and (e) summing the delayed expanded amplitude digital data signals.

34. The method of claim 33 wherein the non-linear relationship between the compressed and expanded signals is a common power law function.

35. The method of claim 33 wherein the non-linear relationship between the compressed and expanded signals is a common logarithmic function.

36. The method of claim 33 wherein the non-linear relationship between the compressed and expanded signals can be represented by a connected series of straight lines approximating a power law function.

37. The method of claim 33 wherein the analog echo signals are compressed in bipolar amplifier means providing output signals which are non-linearly related to the input signals.

38. The method of claim 33 wherein the analog echo signals are compressed in the analog-to-digital converter device.

39. The method of claim 38 wherein the analog echo signals are compressed with linear resistor ladder means by varying the reference voltage to the resistor ladder means in proportion to the input signal level.

40. The method of claim 38 wherein the analog echo signals are compressed with non-linear resistor ladder means by maintaining a fixed reference voltage level across the non-linear resistor ladder means.

41. The method of claim 33 which further includes linear preamplification of the analog echo signals prior to non-linear compression.

42. The method of claim 41 wherein the linear preamplification and non-linear compression is achieved with single non-linear bipolar amplifier means.

43. The method of claim 33 wherein a linear analog-to-digital converter device is employed with look-up table means to achieve the signal expansion.

44. In an ultrasonic coherent medical imaging system, a method of processing the bipolar analog echo signals to provide increased dynamic range comprising the steps of:

(a) producing analog echo voltage singals with a phased array of transducer elements, (b) demodulating the analog echo voltage signals to provide demodulated bipolar analog echo voltage signals of a different phase, the demodulation being provided at a predetermined excitation frequency with phase being determined by the product of a predetermined reference angular frequency and a predetermined time interval corresponding to the distance between respective transducer element and detected object points so as to cause each data signal to occur at substantially the same time, (c) processing each of the demodulated analog echo voltage signals with separate means each having at least one analog-to-digital converter device to separately compress the amplitude of the demodulated analog echo voltage signals and provide separate streams of digital data bearing a mathematical relationship to the respective analog echo voltage signals which approximates a non-linear power function, (d) separately expanding the amplitude of each stream of compressed amplitude digital data signals from the respective analog-to-digital converter devices in accordance with the inverse of the previously employed mathematical power function and thereby obtain individual expanded amplitude digital data signals which are linearly related to the respective analog echo voltage signals, (e) time delaying each stream of expanded amplitude digital data signals by respective predetermined time intervals corresponding to the distance of a detected object point from the respective transducer elements which causes each data signal to occur at substantially the same time, and (f) separately summing each stream of delayed expanded amplitude digital data signals to provide a combined signal which is a monotonic function of the square of the individual summed digital data streams.

45. The method of claim 44 wherein the non-linear relationship between the compressed and expanded signals is a common power law function.

46. The method of claim 44 wherein the non-linear relationship between the compressed and expanded signals is a common logarithmic function.

47. The method of claim 44 wherein the non-linear relationship between the compressed and expanded signals can be represented by a connected series of straight lines approximating a power law function.

48. The method of claim 44 wherein the demodulated analog echo voltage signals are compressed by bipolar amplifier means providing output signals which are non-linearly related to the input signals.

49. The method of claim 44 wherein the demodulated analog echo voltage signals are compressed in the respective analog-to-digital converter devices.

50. The method of claim 49 wherein the demodulated analog echo voltage signals are compressed with linear resistor ladder means by varying the reference voltage to the resistor ladder means in proportion to the input signal level.

51. The method of claim 49 wherein the demodulated analog echo voltage signals are compressed with non-linear resistor ladder means by maintaining a fixed reference voltage level across the non-linear resistor ladder means.

52. The method of claim 44 wherein linear analog-to-digital converter devices are employed with look-up table means to achieve the signal expansion.

53. The method of claim 44 which further includes linear preamplification of the analog echo voltage signals prior to non-linear compression.

54. The method of claim 53 wherein the linear preamplification and non-linear compression is achieved with single non-linear bipolar amplifier means.

55. The method of claim 44 wherein the analog echo voltage signals are mixed with local oscillator signals prior to compression.

* * * * *

UNITED STATES PATENT AND TRADEMARK OFFICE
CERTIFICATE OF CORRECTION

PATENT NO. : 5,005,419
DATED : April 9, 1991
INVENTOR(S) : Matthew O'Donnell et al It is certified that error appears in the above-identified patent and that said Letters Patent is hereby corrected as shown below:

In column 2,
   line 55, change "tissues" to ---tissue---.
   line 62, change "exexceed" to ---exceed---.

In column 7,
   line 28, change "received" to ---receives---.
   line 39, change "such" to ---each---.

In column 9,
   line 32, after "of" and before "now", insert ---the---.
   line 60, change "frequncy" to ---frequency---.

In column 10,
   line 20, after "fashion" and before "ROM", insert a comma.

Signed and Sealed this

Twentieth Day of October, 1992

Attest:

DOUGLAS B. COMER

Attesting Officer

Acting Commissioner of Patents and Trademarks